US009520578B2

United States Patent
Song et al.

(10) Patent No.: US 9,520,578 B2
(45) Date of Patent: Dec. 13, 2016

(54) FLEXIBLE ORGANIC ELECTROLUMINESCENT DEVICE AND METHOD FOR FABRICATING THE SAME

(71) Applicant: LG DISPLAY CO., LTD., Seoul (KR)

(72) Inventors: SangMoo Song, Gumi-si (KR); JiNo Lee, Paju-si (KR); JungChul Kim, Paju-si (KR); DoHyung Kim, Paju-si (KR); SeHwan Na, Paju-si (KR); Taro Hasumi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 273 days.

(21) Appl. No.: 14/064,786

(22) Filed: Oct. 28, 2013

(65) Prior Publication Data

US 2014/0117341 A1 May 1, 2014

(30) Foreign Application Priority Data

Oct. 31, 2012 (KR) .......................... 10-2012-0122697

(51) Int. Cl.
*H01L 29/08* (2006.01)
*H01L 35/24* (2006.01)
(Continued)

(52) U.S. Cl.
CPC ........... *H01L 51/56* (2013.01); *H01L 27/3246* (2013.01); *H01L 51/0097* (2013.01);
(Continued)

(58) Field of Classification Search
CPC ............... H01L 51/56; H01L 2227/323; H01L 27/3244; H01L 27/3246; H01L 51/0097; H01L 51/5237
See application file for complete search history.

(56) References Cited

U.S. PATENT DOCUMENTS

2002/0158835 A1 10/2002 Kobayashi et al.
2005/0035353 A1* 2/2005 Adachi ................... H01L 27/12
257/72
(Continued)

FOREIGN PATENT DOCUMENTS

CN 1429055 A 7/2003
CN 1638554 A 7/2005
(Continued)

OTHER PUBLICATIONS

Office Action dated Dec. 31, 2015 for corresponding Chinese Patent Application No. 201310526130.4, 14 pages.
(Continued)

*Primary Examiner* — Meiya Li
(74) *Attorney, Agent, or Firm* — Brinks Gilson & Llone

(57) ABSTRACT

A flexible organic electroluminescent device and a method for fabricating the same includes a substrate defined with a display area including a plurality of pixel regions and a non-display area at the outside thereof; a switching thin film transistor and a drive thin film transistor formed at the each pixel region on the substrate; an organic insulating layer deposited on the substrate including the switching thin film transistor and drive thin film transistor to expose a drain electrode of the drive thin film transistor; a first electrode formed in each pixel region on the inorganic insulating layer, and connected to the drain electrode of the drive thin film transistor; banks formed around each pixel region on the substrate including the first electrode and separated from one another; an organic light emitting layer separately formed for each pixel region on the first electrode; a second electrode formed on an entire surface of the display area on the organic light emitting layer; and an organic layer formed on an entire surface of the substrate including the second electrode.

3 Claims, 10 Drawing Sheets

(51) Int. Cl.
*H01L 51/00* (2006.01)
*H01L 51/56* (2006.01)
*H01L 27/32* (2006.01)
*H01L 51/52* (2006.01)

(52) U.S. Cl.
CPC ........ *H01L 51/524* (2013.01); *H01L 51/5256* (2013.01); *H01L 2227/323* (2013.01)

(56) References Cited

U.S. PATENT DOCUMENTS

| | | |
|---|---|---|
| 2005/0218794 A1 | 10/2005 | Seo et al. |
| 2006/0152644 A1* | 7/2006 | Yi .......................... G02F 1/1368 349/42 |
| 2008/0303424 A1* | 12/2008 | Mitsuya .............. H01L 27/3246 313/504 |
| 2009/0001877 A1 | 1/2009 | Park et al. |
| 2012/0161166 A1 | 6/2012 | Yamazaki |

FOREIGN PATENT DOCUMENTS

| | | |
|---|---|---|
| CN | 101296539 A | 10/2008 |
| CN | 101577289 A | 11/2009 |
| CN | 102738194 A | 10/2012 |

OTHER PUBLICATIONS

Office Action dated Dec. 11, 2015 for corresponding German Patent Application No. 10 2013 111 943.3, 15 pages.
Office Action dated Sep. 5, 2016 for corresponding Chinese Application No. 201310526130.4, 6 pages.
Partial English Translation of Office Action dated Sep. 5, 2016 for corresponding Chinese Application No. 201310526130.4, 13 pages.

* cited by examiner

FLEXIBLE ORGANIC ELECTROLUMINESCENT DEVICE AND METHOD FOR FABRICATING THE SAME

CROSS-REFERENCE TO RELATED APPLICATIONS

This application claims the benefit of priority to Korean Patent Application No. 10-2012-0122697, filed on Oct. 31, 2012, which is hereby incorporated by reference for all purposes as if fully set forth herein.

BACKGROUND

1. Field of the Disclosure

The present disclosure relates to an organic electroluminescent device (hereinafter, referred to as an "OLED"), and more particularly, to a flexible organic electroluminescent device for blocking moisture from being infiltrated into the organic electroluminescent device to enhance the life of the organic electroluminescent device, and a method for fabricating the same.

2. Description of the Related Art

An organic electroluminescent device, which is one of types of flat panel displays (FPDs), has high brightness and low operation voltage characteristics. Furthermore, the organic electroluminescent device has a high contrast ratio because of being operated as a self-luminous type display that spontaneously emits light, and allows the implementation of an ultra-thin display. The organic light-emitting diode also has advantages such as facilitating the implementation of moving images using a response time of several microseconds (μs), having no limitation in viewing angle, having stability even at low temperatures, and being driven at low voltages between DC 5 to 15 V, thus facilitating the fabrication and design of a driving circuit thereof.

Furthermore, the fabrication process of the organic electroluminescent device can be carried out using only deposition and encapsulation equipment, and therefore the fabrication process is very simple.

The organic light-emitting diode having such characteristics can be largely divided into a passive matrix type and an active matrix type, and in the passive matrix type, a device may be configured with a matrix form in which the scan and signal lines are crossed with each other, and the scan lines are sequentially driven as time passes to drive each pixel, and thus instantaneous brightness as much as average brightness multiplied by the number of lines may be required to display the average brightness.

However, the active matrix type has a structure in which thin-film transistors, which are switching devices for turning on or off a pixel region, are located for each pixel region, and drive transistors connected to the switching transistors are connected to a power line and organic light emitting diodes, and formed for each pixel region.

Here, a first electrode connected to the drive transistor may be turned on or off in the pixel region unit, and a second electrode facing the first electrode may perform the role of a common electrode, thereby implementing an organic light emitting diode along with an organic light emitting layer interposed between the two electrodes.

In the active matrix type having such characteristics, a voltage applied to the pixel region may be charged at a storage capacitance (Cst), and applied until the next frame signal is applied and thus continuously driven for one screen regardless of the number of scan lines.

Accordingly, the same brightness can be obtained even if a low current is applied, thereby having an advantage of providing low power consumption, fine pitch and large screen sized display, and thus in recent years, active matrix type organic electroluminescent devices have been widely used.

The fundamental structure and operating characteristics of such an active matrix type organic electroluminescent device will be described below with reference to the accompanying drawings.

FIG. 1 is a circuit diagram for one pixel region in a typical active matrix type organic electroluminescent device.

Referring to FIG. 1, one pixel region of a typical active matrix type organic electroluminescent device 10 may include a switching thin film transistor (STr), a drive thin film transistor (DTr), a storage capacitor (Cst), and an organic light emitting diode (E).

A gate line (GL) is formed in the first direction, and a data line (DL) disposed in the second direction crossed with the first direction to define a pixel region (P) along with the gate line (GL) is formed, and a power line (PL) separated from the data line (DL) to apply a power voltage is formed.

A switching thin film transistor (STr) is formed at a portion where the data line (DL) and gate line (GL) are crossed with each other, and a drive thin film transistor (DTr) electrically connected to the switching thin film transistor (STr) is formed within the each pixel region (P).

The drive thin film transistor (DTr) is electrically connected to the organic light emitting diode (E). In other words, a first electrode, which is one side terminal of the organic light emitting diode (E), is connected to a drain electrode of the drive thin film transistor (DTr), and a second electrode, which is the other terminal thereof, is connected to the power line (PL). Here, the power line (PL) transfers a power voltage to the organic light emitting diode (E). Furthermore, a storage capacitor (Cst) is formed between a gate electrode and a source electrode of the drive thin film transistor (DTr).

Accordingly, when a signal is applied through the gate line (GL), the switching thin film transistor (STr) is turned on, and the signal of the data line (DL) is transferred to the gate electrode of the drive thin film transistor (DTr) to turn on the drive thin film transistor (DTr), thereby emitting light through the organic light emitting diode (E). Here, when the drive thin film transistor (DTr) is in a turned-on state, the level of a current flowing through the organic light emitting diode (E) from the power line (PL) is determined, and due to this, the organic light emitting diode (E) may implement a gray scale, and the storage capacitor (Cst) may perform the role of constantly maintaining the gate voltage of the drive thin film transistor (DTr) when the switching thin film transistor (STr) is turned off, thereby allowing the level of a current flowing through the organic light emitting diode (E) to be constantly maintained up to the next frame even when the switching thin film transistor (STr) is in an off state.

FIG. 2 is a plan view schematically illustrating a plurality of sub-pixel regions of an organic electroluminescent device according to the related art, as a schematic view showing moisture being infiltrated through one sub-pixel region and diffused up to adjoining sub-pixel regions.

FIG. 3 is a schematic cross-sectional view of an organic electroluminescent device according to the related art.

FIG. 4 is a schematic enlarged cross-sectional view of an organic electroluminescent device according to the related art, as an enlarged cross-sectional view schematically illustrating moisture infiltrated through a bank being diffused along the bank.

Referring to FIG. 2, in an organic electroluminescent device 10 according to the related art, a display area (AA) is defined on a substrate 11, and a non-display area (NA) is defined at the outside of the display area (AA), and a plurality of pixel regions (P), each defined as a region surrounded by the gate line (not shown) and the data line (not shown) are provided, and the power line (not shown) is provided in parallel to the data line (not shown) in the display area (AA).

A switching thin film transistor (STr) (not shown) and a drive thin film transistor (DTr) (not shown) are formed in the plurality of pixel regions (SP), respectively, and connected to the drive thin film transistor (DTr).

In the organic electroluminescent device 10 according to the related art, the substrate 11 formed with the drive thin film transistor (DTr) and organic light emitting diode (E) is encapsulated by a passivation layer (not shown).

Specifically describing the organic electroluminescent device 10 according to the related art, as illustrated in FIG. 3, the display area (AA) is defined, and the non-display area (NA) is defined at the outside of the display area (AA) on the substrate 11, and a plurality of pixel regions (P), each defined as a region surrounded by the gate line (not shown) and the data line (not shown) are provided, and the power line (not shown) is provided in parallel to the data line (not shown) in the display area (AA).

An insulation material, for example, a buffer layer (not shown) formed of silicon oxide ($SiO_2$) or silicon nitride (NiNx), which is an inorganic insulation material, is provided on the substrate 11.

A semiconductor layer 13 made of pure polysilicon to correspond to the drive region (not shown) and switching region (not shown), respectively, and comprised of a first region 13a forming a channel at the central portion thereof and second regions 13b and 13c in which a high concentration of impurities are doped at both lateral surfaces of the first region 13a is formed at each pixel region (SP) within the display area (AA) at an upper portion of the buffer layer (not shown).

A gate insulating layer 15 is formed on the buffer layer (not shown) including the semiconductor layer 13, and the drive region (not shown) and switching region (not shown) are provided on the gate insulating layer 15, and thus a gate electrode 17 is formed to correspond to the first region 13a of each of the semiconductor layer 13.

A gate line (not shown) connected to a gate electrode (not shown) formed in the switching region (not shown) and extended in one direction is formed on the gate insulating layer 15.

An interlayer insulating layer 19 is formed on an entire surface of the display area on the gate electrode 17 and gate line (not shown). A semiconductor layer contact hole (not shown) for exposing the second regions 13b and 13c, respectively, located at both lateral surfaces of the first region 13a of each of the semiconductor layer, is provided on the interlayer insulating layer 19 and the gate insulating layer 15 at a lower portion thereof.

A data line (not shown) crossed with a gate line (not shown) to define the pixel region (SP) and formed of a second metal material, and a power line (not shown) separated therefrom are formed at an upper portion of the interlayer insulating layer 19 including the semiconductor layer contact hole (not shown). Here, the power line (not shown) may be formed to be separated from and in parallel to the gate line (not shown) on a layer formed with the gate line (not shown), namely, the gate insulating layer.

A source electrode 23a and a drain electrode 23b brought into contact with the second regions 13b and 13c separated from each other, and respectively exposed through the semiconductor layer contact hole (not shown) and formed of the same second metal material as that of the data line (not shown) are formed in the each drive region (not shown) and switching region (not shown) on the interlayer insulating layer 19. Here, the semiconductor layer and gate insulating layer sequentially deposited on the drive region (not shown) and the gate electrode 17 and interlayer insulating layer 19 and the source electrode 23a and drain electrode 23b formed to be separated from each other forms a drive thin film transistor (DTr).

An organic insulating layer 25 having a drain contact hole (not shown) for exposing the drain electrode 23b of the drive thin film transistor (DTr) is formed on the drive thin film transistor (DTr) and switching thin film transistor (not shown).

A first electrode 31 brought into contact with the drain contact hole (not shown) through the drain electrode 23b and the drain contact hole (not shown) of the drive thin film transistor (DTr) and having a separated form for each pixel region (SP) is formed on the organic insulating layer 25.

A bank 33 formed to divide each pixel region (SP) is formed on the first electrode 31. Here, the bank 33 is disposed between adjoining pixel regions (SPs).

An organic light emitting layer 35 comprised of organic light emitting patterns (not shown) for emitting red, green and blue colors, respectively, is formed on the first electrode 31 within each of the pixel region (SP) surrounded by the bank 33.

A second electrode 37 is formed on an entire surface of the display area (AA) at an upper portion of the organic light emitting layer 35 and bank 33. Here, the first electrode 31 and second electrode 37 and the organic light emitting layer 35 interposed between the two electrodes 31 and 37 form an organic light emitting diode (E).

A first passivation layer 39 is formed on an entire surface of the substrate including the second electrode 37.

A high organic molecular substance such as a polymer is coated over the first passivation layer 39 to form an organic layer 41.

A second passivation layer 43 is additionally formed on an entire surface of the substrate including the organic layer 41 to block moisture from being infiltrated through the organic layer 41.

Moreover, though not shown in the drawing, an adhesive is located on an entire surface of the substrate including the second passivation layer 43 to face a barrier film (not shown) for the encapsulation of the organic light emitting diode (E), and the adhesive (not shown) is completely glued to the substrate 11 and barrier film (not shown) and interposed between the substrate 11 and barrier film (not shown).

In this manner, the organic electroluminescent device 10 according to the related art is configured by fixing the substrate 101 to the barrier film (not shown) through the adhesive (not shown) to form a panel state.

As described above, according to an organic electroluminescent device according to the related art, when there exists a defect in the barrier film (not shown) for encapsulation as illustrated in FIGS. 2 and 4, moisture is infiltrated into the pixel region (SP) through the defect and the organic insulating layer 25 which is a planarization layer or infiltrated into the pixel region (SP) through the defect and the bank 33. In particular, when moisture is infiltrated through the bank 33, the moisture is diffused along the bank 33, which is an organic material, thereby causing all the adjoining pixel regions (SPs) to be defective since the bank 33 is adjacent to the adjoining pixel regions (SPs).

According to the related art, when a planarization layer, namely, an organic insulating layer, is not formed in the non-display area to block moisture from being infiltrated into the pixel region (SP) through the defect or planarization layer, it may cause deteriorate the quality due to a step at the inorganic layer or the like disposed on the organic electroluminescent device.

In addition, according to the related art, even when the bank is divided to block moisture from being infiltrated into the pixel region (SP) through the defect or planarization layer, the moisture may be diffused through an organic insulating layer located at a lower portion thereof, and thus there is a limit in preventing moisture from being infiltrated into the pixel region (SP).

SUMMARY

A flexible organic electroluminescent device may include a substrate defined with a display area including a plurality of pixel regions and a non-display area at the outside thereof; a switching thin film transistor and a drive thin film transistor formed at the each pixel region on the substrate; an organic insulating layer deposited on the substrate including the switching thin film transistor and drive thin film transistor to expose a drain electrode of the drive thin film transistor; a first electrode formed in each pixel region on the inorganic insulating layer, and connected to the drain electrode of the drive thin film transistor; banks formed around each pixel region on the substrate including the first electrode and separated from one another; an organic light emitting layer separately formed for each pixel region on the first electrode; a second electrode formed on an entire surface of the display area on the organic light emitting layer; and an organic layer formed on an entire surface of the substrate including the second electrode.

A method of fabricating a flexible organic electroluminescent device may include providing a substrate defined with a display area including a plurality of pixel regions and a non-display area at the outside thereof; forming a switching thin film transistor and a drive thin film transistor at the each pixel region on the substrate; forming an organic insulating layer on the substrate including the switching thin film transistor and drive thin film transistor to expose a drain electrode of the drive thin film transistor; forming a first electrode layer connected to the drain electrode of the drive thin film transistor in each pixel region on the inorganic insulation; forming banks separated from one another around each pixel region on the substrate including the first electrode; forming an organic light emitting layer separately for each pixel region on the first electrode; forming a second electrode on an entire surface of the display area on the organic light emitting layer; and forming an organic layer formed on an entire surface of the substrate including the second electrode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE EXEMPLARY EMBODIMENTS

Hereinafter, an organic electroluminescent device according to preferred embodiments of the present invention will be described below with reference to the accompanying drawings.

Figure 1:
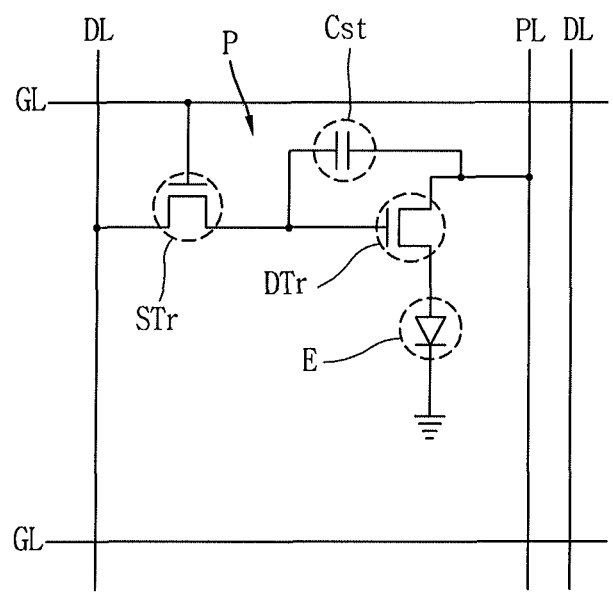
FIG. 1 is a circuit diagram for one pixel region in a typical active matrix type organic electroluminescent device.
Figure 2:
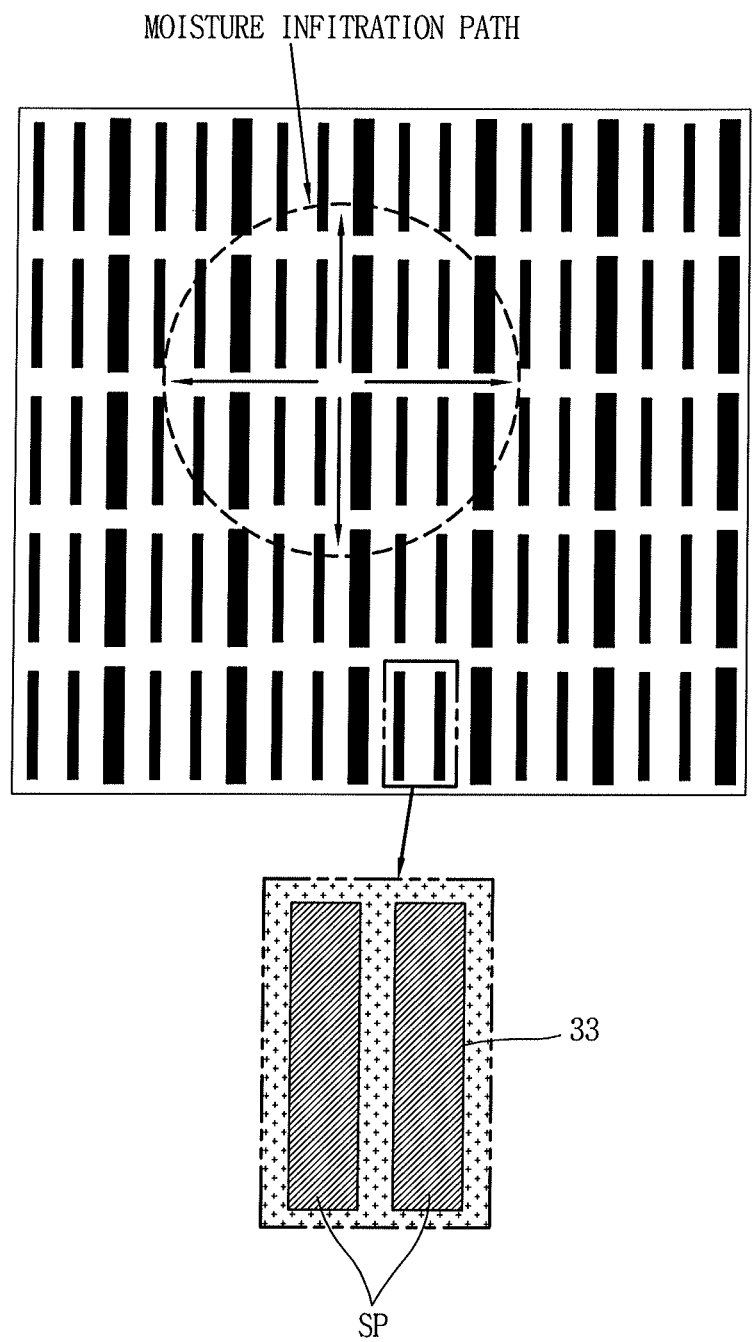
FIG. 2 is a plan view schematically illustrating a plurality of sub-pixel regions of an organic electroluminescent device according to the related art, as a schematic view showing moisture being infiltrated through one sub-pixel region and diffused up to adjoining sub-pixel regions.
Figure 3:
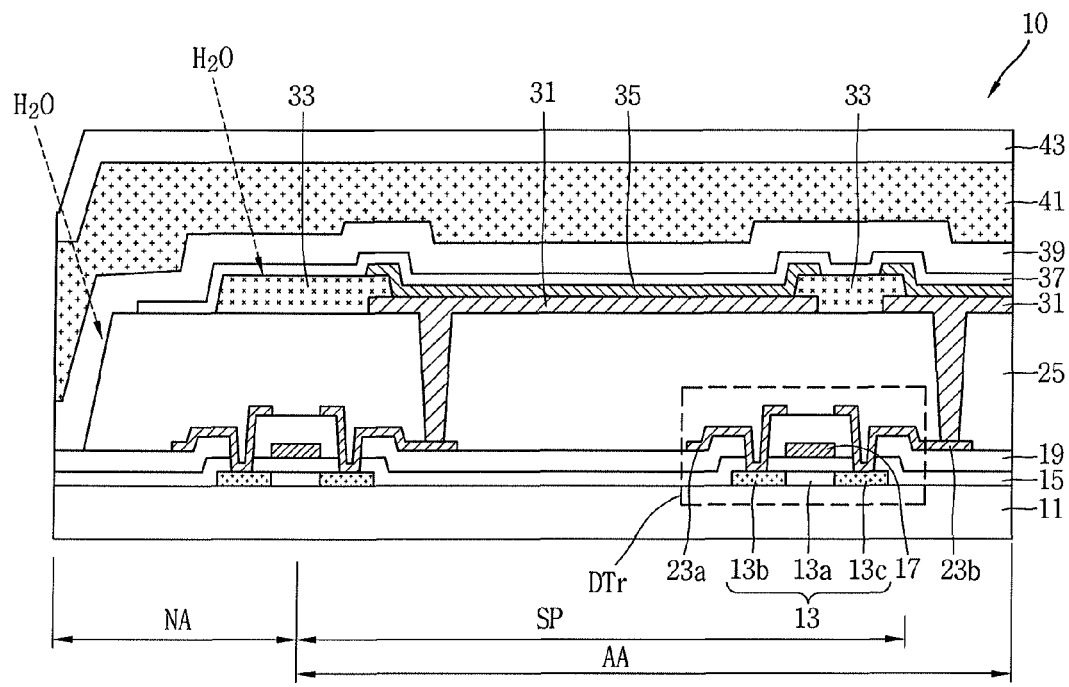
FIG. 3 is a schematic cross-sectional view of an organic electroluminescent device according to the related art.
Figure 4:
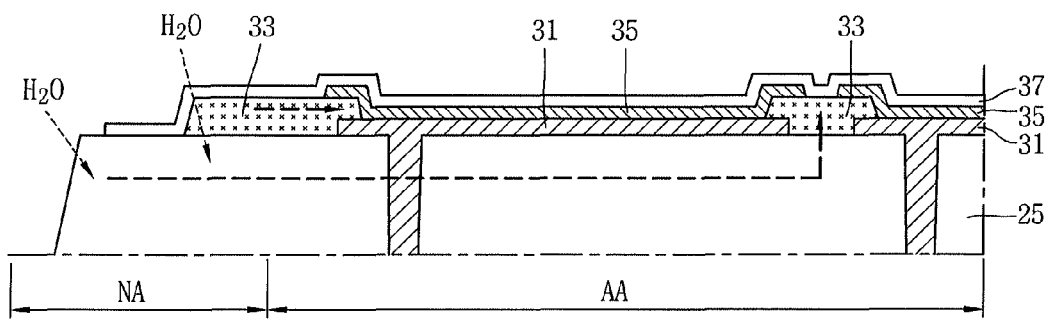
FIG. 4 is a schematic enlarged cross-sectional view of an organic electroluminescent device according to the related art, as an enlarged cross-sectional view schematically illustrating moisture infiltrated through a bank being diffused along the bank.
Figure 5:
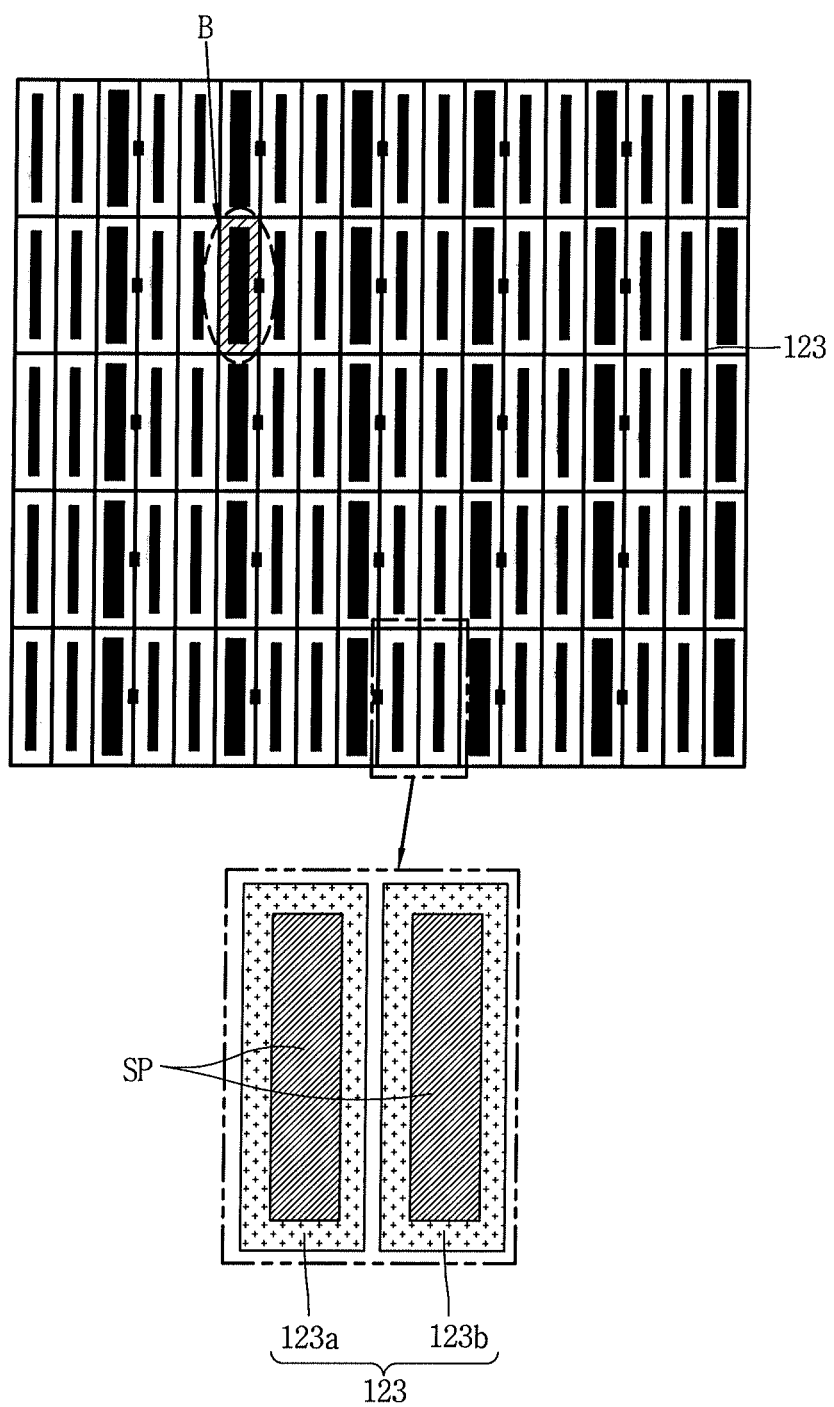
FIG. 5 is a plan view schematically illustrating a plurality of sub-pixel regions of an flexible organic electroluminescent device according to the present invention, as a view schematically showing that banks are separated between each pixel region and thus moisture is not diffused up to adjoining sub-pixel regions even when the moisture is infiltrated into one sub-pixel region.

FIG. 5 is a plan view schematically illustrating a plurality of sub-pixel regions of an flexible organic electroluminescent device according to the present invention, as a view schematically showing that banks are separated between each pixel region and thus moisture is not diffused up to adjoining sub-pixel regions even when the moisture is infiltrated into one sub-pixel region.

Figure 6:
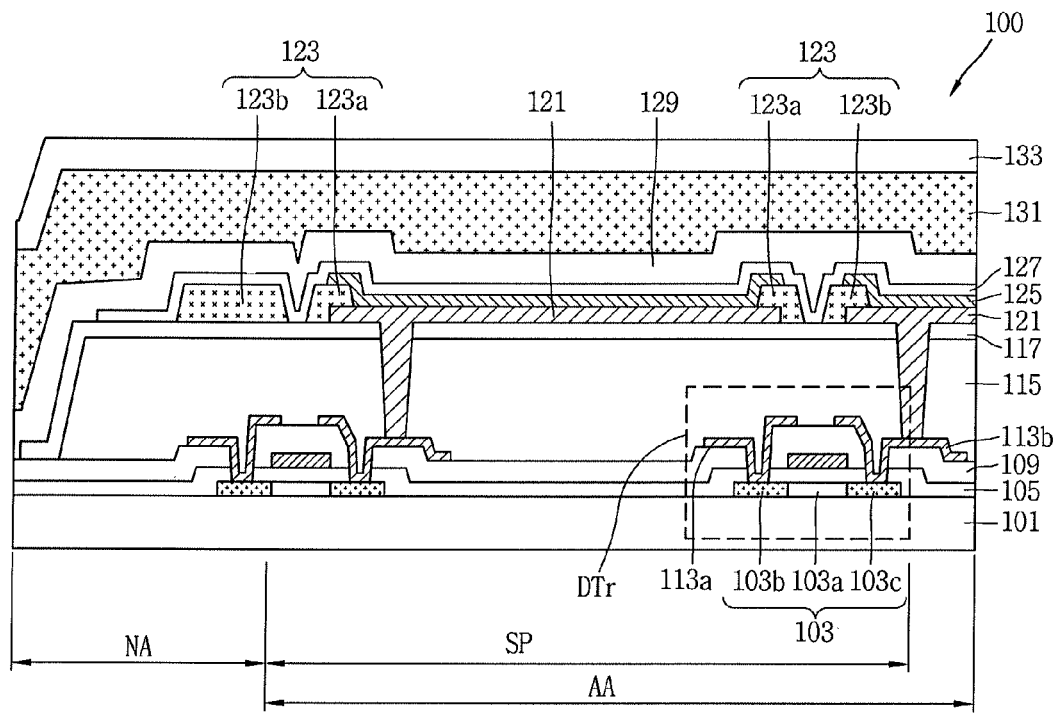
FIG. 6 is a schematic cross-sectional view of a flexible organic electroluminescent device according to the present invention.

FIG. 6 is a schematic cross-sectional view of a flexible organic electroluminescent device according to the present invention.

Figure 7:
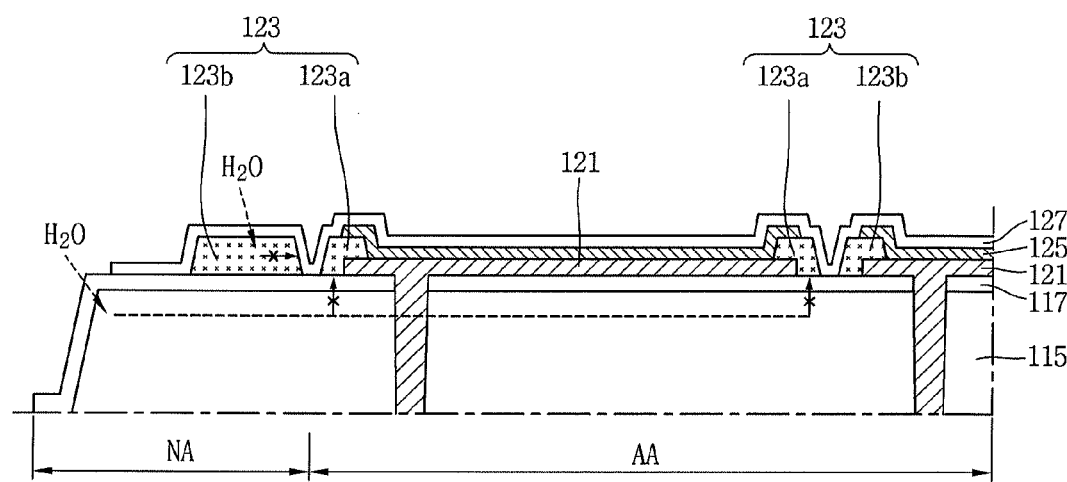
FIG. 7 is a schematic enlarged cross-sectional view of a flexible organic electroluminescent device according to the present invention, as an enlarge cross-sectional view schematically illustrating that moisture infiltrated into one pixel region through the bank is not diffused into an adjoining pixel region.

FIG. 7 is a schematic enlarged cross-sectional view of a flexible organic electroluminescent device according to the present invention, as an enlarge cross-sectional view schematically illustrating that moisture infiltrated into one pixel region through the bank is not diffused into an adjoining pixel region.

A flexible organic electroluminescent device 100 according to an embodiment of the present invention is divided into a top emission type and a bottom emission type according to the transmission direction of emitted light, and hereinafter, according to the present invention, the top emission type will be described as an example.

Referring to FIGS. 5, 6 and 7, in a flexible organic electroluminescent device 100 according to the present invention, a substrate 101 formed with the drive thin film transistor (DTr) and the organic light emitting diodes (E) is encapsulated by a barrier film (not shown).

Specifically describing the flexible organic electroluminescent device 100 according to the present invention, as illustrated in FIG. 6, a display area (AA) is defined, and a non-display area (NA) is defined at the outside of the display area (AA) on the substrate 101, and a plurality of pixel regions (P), each defined as a region surrounded by the gate line (not shown) and the data line (not shown) are provided, and the power line (not shown) is provided in parallel to the data line (not shown) in the display area (AA).

Here, the flexible substrate 101 is made of a flexible glass substrate or plastic material having a flexible characteristic to maintain display performance as it is even when the flexible organic electroluminescent device 100 is bent like a paper.

Furthermore, a buffer layer (not shown) made of an insulation material, silicon oxide (SiO$_2$) or silicon nitride (NiNx), which is an inorganic insulation material, is provided on the substrate 101. Here, the buffer layer (not shown) is formed at a lower portion of the semiconductor layer 103 formed during the subsequent process to prevent the characteristics of the semiconductor layer 103 from being deteriorated due to the emission of alkali ions coming out of an inner portion of the substrate 101 during the crystallization of the semiconductor layer 103.

A semiconductor layer 103 made of pure polysilicon to correspond to the drive region (not shown) and switching region (not shown), respectively, and comprised of a first region 103a forming a channel at the central portion thereof and second regions 103b and 103c in which a high concentration of impurities are doped at both lateral surfaces of the first region 103a is formed at each pixel region (P) within the display area (AA) at an upper portion of the buffer layer (not shown).

A gate insulating layer 105 is formed on the buffer layer (not shown) including the semiconductor layer 103, and a gate electrode 107 is formed to correspond to the first region 103a of each of the semiconductor layer 103 in the drive region (not shown) and switching region (not shown) on the gate insulating layer 105.

A gate line (not shown) connected to a gate electrode (not shown) formed in the switching region (not shown) and extended in one direction is formed on the gate insulating layer 105. Here, the gate electrode 107 and the gate line (not shown) may have a single layer structure which is made of a first metal material having a low resistance characteristic, for example, any one of aluminium (Al), aluminium alloy (AlNd), copper (Cu), copper alloy, molybdenum (Mo), and molytitanium (MoTi), or may have a double layer or triple layer structure which is made of two or more of the first metal materials. According to the drawing, it is illustrated that the gate electrode 107 and gate line (not shown) have a single layer structure.

An interlayer insulating layer 109, which is made of an insulation material, for example, silicon oxide (SiO$_2$) or silicon nitride (NiNx), which is an inorganic insulation material, is formed on an entire surface of the display area on the gate electrode 107 and gate line (not shown). Here, a semiconductor layer contact hole (not shown; refer to reference numerals 111a and 111b in FIG. 8B) for exposing the second regions 103b and 103c, respectively, located at both lateral surfaces of the first region 103a of each of the semiconductor layer, is provided on the interlayer insulating layer 109 and the gate insulating layer 105 at a lower portion thereof.

Figure 8A:
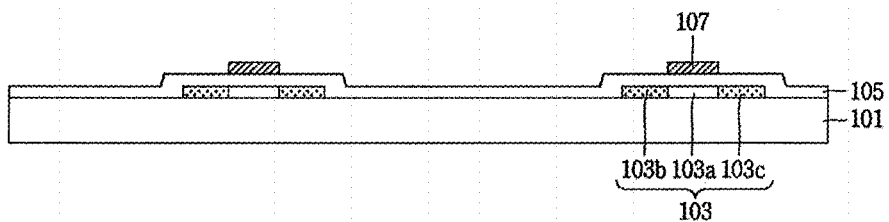
FIGS. 8A through 8J are process cross-sectional views schematically illustrating a method of fabricating a flexible organic electroluminescent device according to the present invention.
Figure 8B:
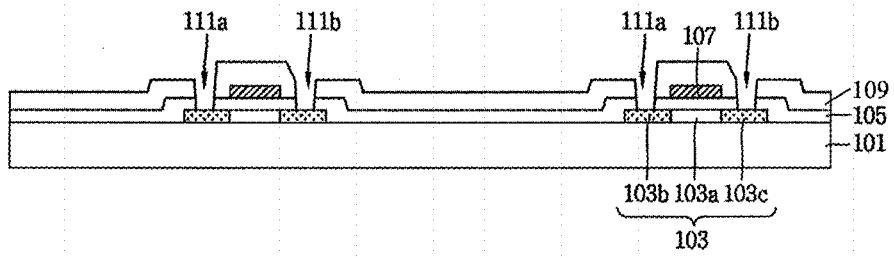

A data line (not shown) crossed with a gate line (not shown) to define the pixel region (SP) and made of a second metal material, for example, any one or two or more of aluminium (Al), aluminium alloy (AlNd), copper (Cu), copper alloy, molybdenum (Mo), molytitanium (MoTi), chromium (Cr), and titanium (Ti), and a power line (not shown) separated therefrom are formed at an upper portion of the interlayer insulating layer 109 including the semiconductor layer contact hole (not shown; refer to reference numerals 111a and 111b in FIG. 8B). Here, the power line (not shown) may be formed to be separated from and in parallel to the gate line (not shown) on a layer formed with the gate line (not shown), namely, the gate insulating layer.

A source electrode 113a and a drain electrode 113b brought into contact with the second regions 103b and 103c separated from each other, and respectively exposed through the semiconductor layer contact hole (not shown; refer to reference numerals 111a and 111b in FIG. 8B) and formed of the same second metal material as that of the data line (not shown) are formed in the each drive region (not shown) and switching region (not shown) on the interlayer insulating layer 109. Here, the semiconductor layer and gate insulating layer sequentially deposited on the drive region (not shown) and the gate electrode 107 and interlayer insulating layer 109 and the source electrode 113a and drain electrode 113b formed to be separated from each other forms a drive thin film transistor (DTr).

On the other hand, though it is shown in the drawing that all the data line (not shown) and source electrode 113a and drain electrode 113b have a single layer structure as an example, the constituent elements may have a double layer or triple layer structure.

Here, though not shown in the drawing, a switching thin film transistor (not shown) having the same layer structure as that of the drive thin film transistor (DTr) is also formed in the switching region (not shown). Here, the switching thin film transistor (not shown) is electrically connected to the drive thin film transistor (DTr), the gate line (not shown) and data line 113. In other words, the gate line and data line 113 are connected to a gate electrode (not shown) and a source electrode (not shown), respectively, of the switching thin film transistor (not shown), and the drain electrode (not shown) of the switching thin film transistor (not shown) is electrically connected to the gate electrode 107 of the drive thin film transistor (DTr).

According to the substrate 101 for an organic electroluminescent device in accordance with the present invention, it is shown that the drive thin film transistor (DTr) and switching thin film transistor (not shown) have a semiconductor layer 103 with polysilicon, and configured with a top gate type as an example, but it should be understood by those skilled in the art that the drive thin film transistor (DTr) and switching thin film transistor (not shown) can be also configured with a bottom gate type having a semiconductor layer with amorphous silicon.

When the drive thin film transistor (DTr) and switching thin film transistor (not shown, STr) are configured with a bottom gate type, the layer structure includes a gate electrode, a gate insulating layer, an active layer with pure amorphous silicon, semiconductor layers separated from each other and made of an ohmic contact layer having amorphous silicon doped with impurities, and a source electrode and a drain electrode separated from each other. Here, it has a characteristic that the gate line is formed to be connected to the gate electrode of the switching thin film transistor on a layer formed with the gate electrode, and the data line is formed to be connected to the source electrode on a layer formed with the source electrode of the switching thin film transistor.

An organic insulating layer 115 and an inorganic insulating layer 117 having a drain contact hole (not shown; refer to reference numeral 119 in FIG. 8D) for exposing the drain electrode 113b of the drive thin film transistor (DTr) is formed on the drive thin film transistor (DTr) and switching thin film transistor (not shown). Here, a high organic molecular substance such as a polymer is sued for the organic insulating layer 115, and silicon oxide ($SiO_2$) or silicon nitride (NiNx), which is an inorganic insulation material, is used for the inorganic insulating layer 117.

A first electrode 121 brought into contact with the drain contact hole (not shown) through the drain electrode 113b and the drain contact hole of the drive thin film transistor (DTr) and having a separated form for each pixel region (SP) is formed on the inorganic insulating layer 117.

A bank 123 made of an insulation material, particularly, for example, benzo-cyclo-butene (BCB), polyimide or photo acryl is formed in the boundary and non-display area (NA) of each pixel region (SP) on the first electrode 121. Here, a first and a second bank 123a and 123b constituting the bank 123 is formed to be overlapped with the edge of the first electrode 121 in the form of surrounding the each pixel region (SP), and the display area (AA) forms a lattice shape having a plurality of opening portions as a whole.

The banks 123a and 123b are formed around each pixel region (SP), and the banks 123a and 123b are formed in a separate manner independently from each other. In particular, the first banks 123a and 123b around the each pixel region (SP) are separated from each other by a predetermined distance. Part of the second bank 123b is also formed in the non-display area (NA).

Accordingly, even when a defect or moisture is infiltrated into the organic electroluminescent device 100 from the outside, the first and second banks 123a and 123b around each pixel region (SP) are independently separated from each other, thereby preventing moisture infiltrated into one pixel region (SP) from being diffused to another adjoining pixel region (SP) through the separated bank.

An organic light emitting layer 125 comprised of organic light emitting patterns (not shown) for emitting red, green and blue colors, respectively, is formed on the first electrode 121 within each of the pixel region (SP) surrounded by the first and second banks 123a and 123b. The organic light emitting layer 125 may be configured with a single layer made of an organic light emitting material, and otherwise, though not shown in the drawing, may be configured with a multiple layer with a hole injection layer, a hole transporting layer, an emitting material layer, an electron transporting layer, and an electron injection layer.

A second electrode 127 is formed on an entire surface of the display area (AA) at an upper portion of the organic light emitting layer 125 and first and second banks 123a and 123b. Here, the first electrode 121 and second electrode 127 and the organic light emitting layer 125 interposed between the two electrodes 121 and 127 form an organic light emitting diode (E).

For the organic light emitting diode (E), when a predetermined voltage is applied to the first electrode 121 and second electrode 127 according to the selected color signal, holes injected from the first electrode 121 and electrons provided from the second electrode 127 is transported to the organic light emitting layer 125 to form excitons, and light is generated and emitted in a visible light form when the excitons is transitioned from the excited state to the ground state. At this time, the emitted light is exited to the outside through the transparent second electrode 127, and thus the flexible organic electroluminescent device 100 implements any image.

A first passivation layer 129 made of an insulation material, particularly, silicon oxide ($SiO_2$) or silicon nitride (NiNx), which is an inorganic insulation material, is formed on an entire surface of the substrate including the second electrode 127. Here, moisture infiltration to the organic light emitting layer 125 cannot be completely suppressed by only the second electrode 127, and thus the first passivation layer 129 is formed on the second electrode 127 to completely suppress moisture infiltration to the organic light emitting layer 125.

A high organic molecular substance such as a polymer is coated over the first passivation layer 129 to form an organic layer 131. Here, olefin polymers (polyethylene, polypropylene), polyethylene terephthalate (PET), epoxy resin, fluororesin, polysiloxane, and the like may be used for the high molecular layer.

A second passivation layer 133 made of an insulation material, for example, silicon oxide ($SiO_2$) or silicon nitride (NiNx), which is an inorganic insulation material, is additionally formed on an entire surface of the substrate including the organic layer 131 to block moisture from being infiltrated through the organic layer 131.

Moreover, though not shown in the drawing, an adhesive is located on an entire surface of the substrate including the second passivation layer 133 to face a barrier film (not shown) for the encapsulation of the organic light emitting diode (E), and the adhesive (not shown) made of any one of a frit having a transparent adhesive characteristic, an organic insulation material, and a high molecular substance is completely glued to the substrate 101 and barrier film (not shown) with no air layer and interposed between the substrate 101 and barrier film (not shown). Here, according to the present invention, a case of using a press sensitive adhesive (PSA) for the adhesive (not shown) will be described as an example.

In this manner, the substrate 101 is fixed to the barrier film (not shown) through the adhesive (not shown) to form a panel state, thereby configuring an organic electroluminescent device 100 according to an embodiment of the present invention.

Therefore, according to an organic electroluminescent device in accordance with an embodiment of the present invention, an inorganic insulating layer may be additionally formed on an organic insulating layer on a substrate including a switching thin film transistor and a drive thin film transistor to cover an edge portion of the organic insulating layer so as to block a defect or moisture in advance from being infiltrated into the organic electroluminescent device, thereby enhancing the life of the organic electroluminescent device.

According to an organic electroluminescent device in accordance with an embodiment of the present invention, banks may be formed in a separate manner independently from one another around each pixel region to prevent moisture from being diffused into another adjoining pixel region even when the defect or moisture is infiltrated into the organic electroluminescent device from the outside, thereby enhancing the reliability of the panel.

In addition, according to an organic electroluminescent device in accordance with an embodiment of the present invention, the average height of the substrate may be uniformly maintained on the display unit and bezel portion, and also an adhesive, for example, a gluing agent, for adhering the display to an upper substrate, for example, an encapsulation glass substrate, a plastic plate and a polarizer, may be formed in a thin manner, thereby enhancing the reliability of the panel.

A method of fabricating a flexible organic electroluminescent device according to the present invention will be described below with reference to FIGS. 8A through 8J.

FIGS. 8A through 8J are process cross-sectional views schematically illustrating a method of fabricating a flexible organic electroluminescent device according to the present invention.

As illustrated in FIG. 8A, a substrate 101 having a flexible characteristic defined with a display area (AA) and a non-display area (NA) at the outside of the display area (AA) is prepared. Here, the flexible substrate 101 is made of a flexible glass substrate or plastic material having a flexible characteristic to maintain display performance as it is even when the flexible organic electroluminescent device 100 is bent like a paper.

Next, a buffer layer (not shown) made of an insulation material, for example, silicon oxide ($SiO_2$) or silicon nitride (NiNx), which is an inorganic insulation material, is formed on the substrate 101. Here, the buffer layer (not shown) is formed at a lower portion of the semiconductor layer 103 formed during the subsequent process to prevent the characteristics of the semiconductor layer 103 from being deteriorated due to the emission of alkali ions coming out of an inner portion of the substrate 101 during the crystallization of the semiconductor layer 103.

Subsequently, a semiconductor layer 103 made of pure polysilicon to correspond to the drive region (not shown) and switching region (not shown), respectively, and comprised of a first region 103a forming a channel at the central portion thereof and second regions 103b and 103c in which a high concentration of impurities are doped at both lateral surfaces of the first region 103a is formed at each pixel region (P) within the display area (AA) at an upper portion of the buffer layer (not shown).

Subsequently, a gate insulating layer 105 is formed on the buffer layer (not shown) including the semiconductor layer 103, and a gate electrode 107 is formed to correspond to the first region 103a of each of the semiconductor layer 103 in the drive region (not shown) and switching region (not shown) on the gate insulating layer 105.

Here, a gate line (not shown) connected to a gate electrode 107 formed in the switching region (not shown) and extended in one direction is formed on the gate insulating layer 105. Here, the gate electrode 107 and the gate line (not shown) may have a single layer structure which is made of a first metal material having a low resistance characteristic, for example, any one of aluminium (Al), aluminium alloy (AlNd), copper (Cu), copper alloy, molybdenum (Mo), and molytitanium (MoTi), or may have a double layer or triple layer structure which is made of two or more of the first metal materials. According to the drawing, it is illustrated as an example that the gate electrode 107 and gate line (not shown) have a single layer structure.

Next, as illustrated in FIG. 8B, an interlayer insulating layer 109, which is made of an insulation material, for example, silicon oxide ($SiO_2$) or silicon nitride (NiNx), which is an inorganic insulation material, is formed on an entire surface of the display area on the gate electrode 107 and gate line (not shown).

Subsequently, the interlayer insulating layer 109 and the gate insulating layer 105 at a lower portion thereof are selectively patterned to form a semiconductor layer contact hole 111a and 111b for exposing the second regions 103b and 103c, respectively, located at both lateral surfaces of the first region 103a of each of the semiconductor layer.

Figure 8C:
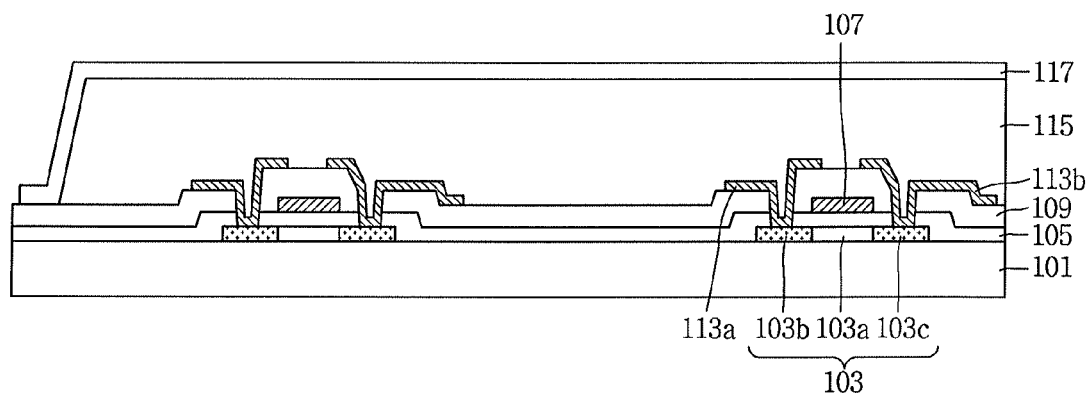

Next, as illustrated in FIG. 8C, a second metal material layer (not shown) crossed with a gate line (not shown) to define the pixel region (SP) is formed at an upper portion of the interlayer insulating layer 109 including the semiconductor layer contact hole 111a and 111b. Here, the second metal material layer (not shown) is made of any one or two or more of aluminium (Al), aluminium alloy (AlNd), copper (Cu), copper alloy, molybdenum (Mo), molytitanium (MoTi), chromium (Cr), and titanium (Ti).

Subsequently, the second metal material layer (not shown) is selectively patterned to form a data line (not shown) crossed with the gate line (not shown) to define the pixel region (SP), and a power line (not shown) separated therefrom. Here, the power line (not shown) may be formed to be separated from and in parallel to the gate line (not shown) on a layer formed with the gate line (not shown), namely, the gate insulating layer.

In addition, during the formation of the data line (not shown), a source electrode 113a and a drain electrode 113b brought into contact with the second regions 103b, 103c separated from each other, and respectively exposed through the semiconductor layer contact hole 111a and 111b and formed of the same second metal material as that of the data line (not shown) are formed at the same time in the each drive region (not shown) and switching region (not shown) on the interlayer insulating layer 109. Here, the semiconductor layer and gate insulating layer sequentially deposited on the drive region (not shown) and the gate electrode 107 and interlayer insulating layer 109 and the source electrode 113a and drain electrode 113b formed to be separated from each other forms a drive thin film transistor (DTr).

Though it is shown in the drawing that all the data line (not shown) and source electrode 113a and drain electrode 113b have a single layer structure as an example, the constituent elements may have a double layer or triple layer structure.

Here, though not shown in the drawing, a switching thin film transistor (not shown) having the same layer structure as that of the drive thin film transistor (DTr) is also formed in the switching region (not shown). Here, the switching thin film transistor (not shown) is electrically connected to the drive thin film transistor (DTr), the gate line (not shown) and data line 113. In other words, the gate line and data line 113 are connected to a gate electrode (not shown) and a source electrode (not shown), respectively, of the switching thin film transistor (not shown), and the drain electrode (not shown) of the switching thin film transistor (not shown) is electrically connected to the gate electrode 107 of the drive thin film transistor (DTr).

On the other hand, according to the substrate 101 for an organic electroluminescent device in accordance with an embodiment of the present invention, it is shown that the drive thin film transistor (DTr) and switching thin film transistor (not shown) have a semiconductor layer 103 with polysilicon, and configured with a top gate type as an example, but it should be understood by those skilled in the art that the drive thin film transistor (DTr) and switching thin film transistor (not shown) can be also configured with a bottom gate type having a semiconductor layer with amorphous silicon.

When the drive thin film transistor (DTr) and switching thin film transistor (not shown, STr) are configured with a bottom gate type, the layer structure includes a gate electrode, a gate insulating layer, an active layer with pure amorphous silicon, semiconductor layers separated from each other and made of an ohmic contact layer having amorphous silicon doped with impurities, and a source electrode and a drain electrode separated from each other. Here, it has a characteristic that the gate line is formed to be connected to the gate electrode of the switching thin film transistor on a layer formed with the gate electrode, and the data line is formed to be connected to the source electrode on a layer formed with the source electrode of the switching thin film transistor.

Next, an organic insulating layer 115 and an inorganic insulating layer 117 are sequentially deposited on the drive thin film transistor (DTr) and switching thin film transistor (not shown). Here, a high organic molecular substance such as a polymer is sued for the organic insulating layer 115, and silicon oxide ($SiO_2$) or silicon nitride (NiNx), which is an inorganic insulation material, is used for the inorganic insulating layer 117.

Figure 8D:
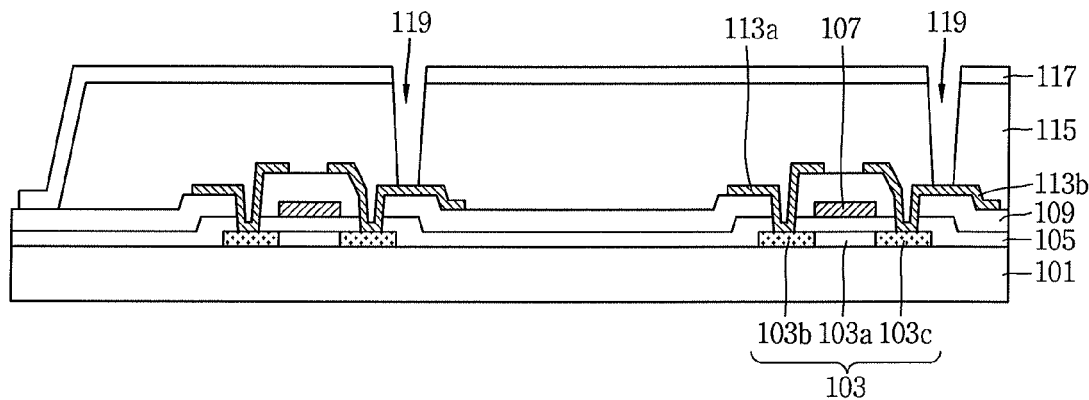

Subsequently, as illustrated in FIG. 8D, the organic insulating layer 115 and inorganic insulating layer 117 are selectively patterned to form a drain contact hole 119 for exposing the drain electrode 113b of the drive thin film transistor (DTr).

Figure 8E:
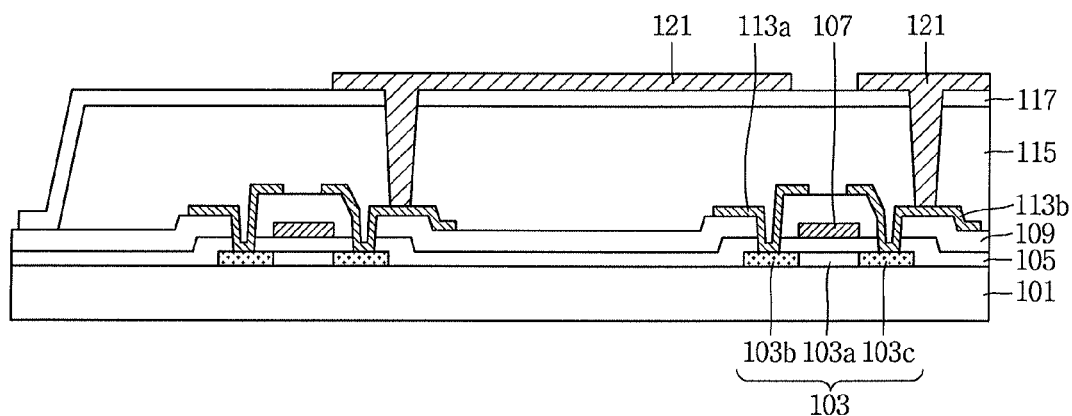

Next, as illustrated in FIG. 8E, a third metal material layer (not shown) is deposited on the inorganic insulating layer 117, and then the third metal material layer (not shown) is selectively patterned to form a first electrode 121 brought into contact with the drain contact hole (not shown) through the drain electrode 113b and the drain contact hole of the drive thin film transistor (DTr) and having a separated form for each pixel region (SP) is formed through the drain contact hole 119. Here, the third metal material layer (not shown) is made of any one or two or more of aluminium (Al), aluminium alloy (AlNd), copper (Cu), copper alloy, molybdenum (Mo), molytitanium (MoTi), chromium (Cr), and titanium (Ti).

Subsequently, though not shown in the drawing, an insulation material layer (not shown) made of benzo-cyclo-butene (BCB), polyimide or photo acryl, for example, is formed in the boundary and non-display area (NA) of each pixel region (SP) on the first electrode 121.

Figure 8F:
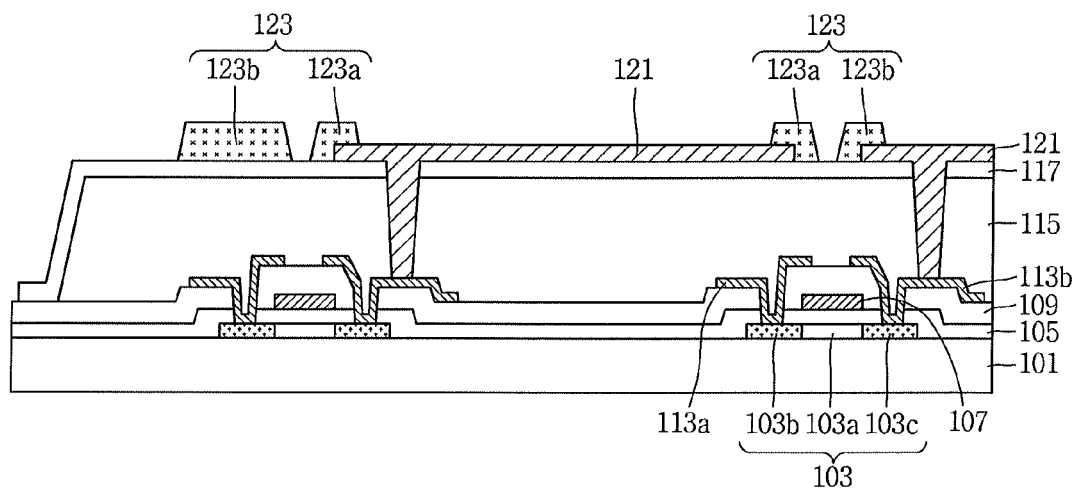

Next, as illustrated in FIG. 8F, the insulation material layer (not shown) is selectively patterned to form a bank 123 including a first and a second bank 123a and 123b. Here, the first and second banks 123a and 123b are formed to be overlapped with the edge of the first electrode 121 in the form of surrounding the each pixel region (SP), and the display area (AA) forms a lattice shape having a plurality of opening portions as a whole.

Furthermore, part of the second bank 123b is formed with a shape that covers part of the upper portion of the non-display area (NA). The first and second banks 123a and 123b are formed around each pixel region (SP), and the first and second banks 123a and 123b are formed in a separate manner independently from each other. In particular, the banks 123a and 123b around the each pixel region (SP) are separated from each other by a predetermined distance.

Accordingly, even when a defect or moisture is infiltrated into the organic electroluminescent device 100 from the outside, the first and second banks 123a and 123b around each pixel region (SP) are independently separated from each other, thereby preventing moisture infiltrated into one pixel region (SP) from being diffused to another adjoining pixel region (SP) through the separated bank.

Figure 8G:
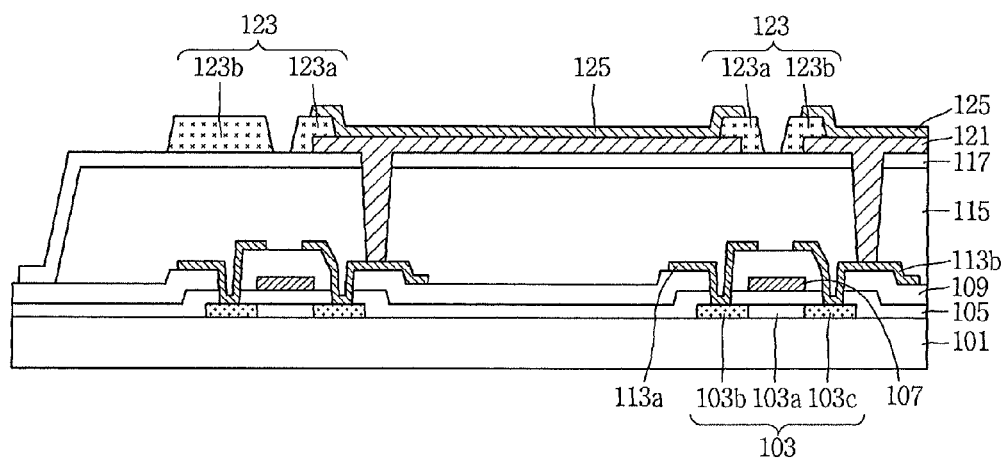

Subsequently, as illustrated in FIG. 8G, an organic light emitting layer 125 comprised of organic light emitting patterns (not shown) for emitting red, green and blue colors, respectively, is formed on the first electrode 121 within each of the pixel region (SP) surrounded by the first and second banks 123a and 123b. Here, the organic light emitting layer 125 may be configured with a single layer made of an organic light emitting material, and otherwise, though not shown in the drawing, may be configured with a multiple layer with a hole injection layer, a hole transporting layer, an emitting material layer, an electron transporting layer, and an electron injection layer.

Figure 8H:
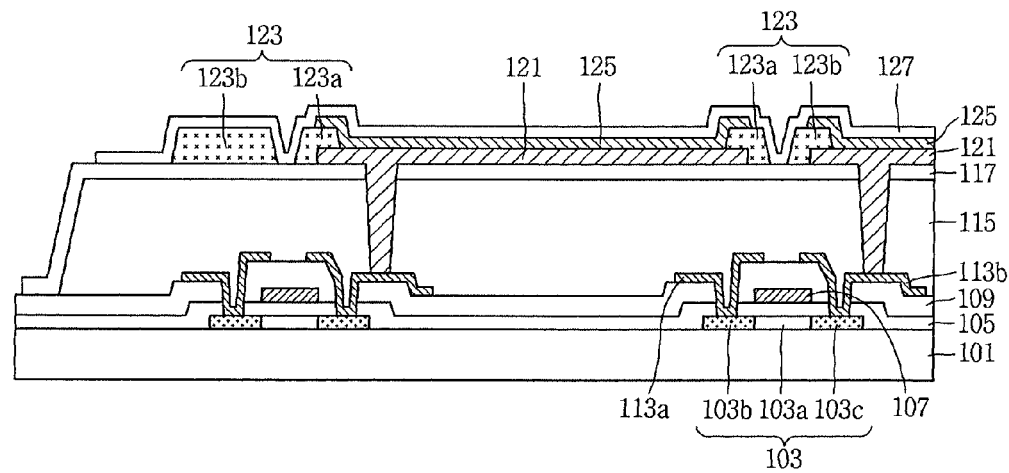

Next, as illustrated in FIG. 8H, a second electrode 127 is formed on an entire surface of the display area (AA) including an upper portion of the organic light emitting layer 125 and first and second banks 123a and 123b. Here, a transparent conductive material for transmitting light, for example, any one of conductive materials including ITO and IZO may be selected and used for the second electrode 127. In this manner, the first electrode 121 and second electrode 127 and the organic light emitting layer 125 interposed between the two electrodes 121 and 127 form an organic light emitting diode (E).

Accordingly, for the organic light emitting diode (E), when a predetermined voltage is applied to the first electrode 121 and second electrode 127 according to the selected color signal, holes injected from the first electrode 121 and electrons provided from the second electrode 127 is transported to the organic light emitting layer 125 to form excitons, and light is generated and emitted in a visible light form when the excitons is transitioned from the excited state to the ground state. At this time, the emitted light is exited to the outside through the transparent second electrode 127, and thus the flexible organic electroluminescent device 100 implements any image.

Figure 8I:
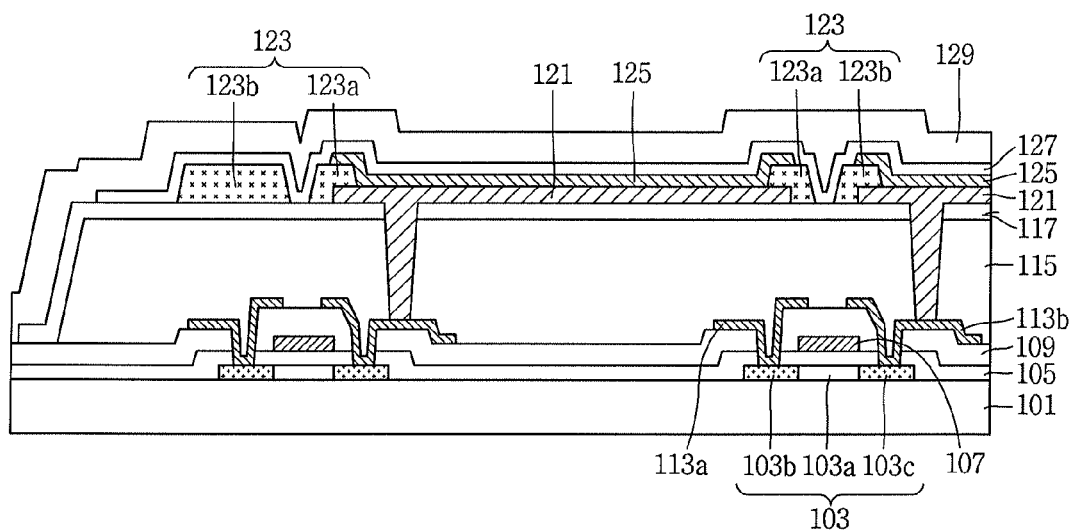

Subsequently, as illustrated in FIG. 8I, a first passivation layer 129 made of an insulation material, particularly, silicon oxide ($SiO_2$) or silicon nitride (NiNx), which is an inorganic insulation material, is formed on an entire surface of the substrate including the second electrode 127. Here, moisture infiltration to the organic light emitting layer 125 cannot be completely suppressed by only the second electrode 127, and thus the first passivation layer 129 is formed on the second electrode 127 to completely suppress moisture infiltration to the organic light emitting layer 125.

Figure 8J:
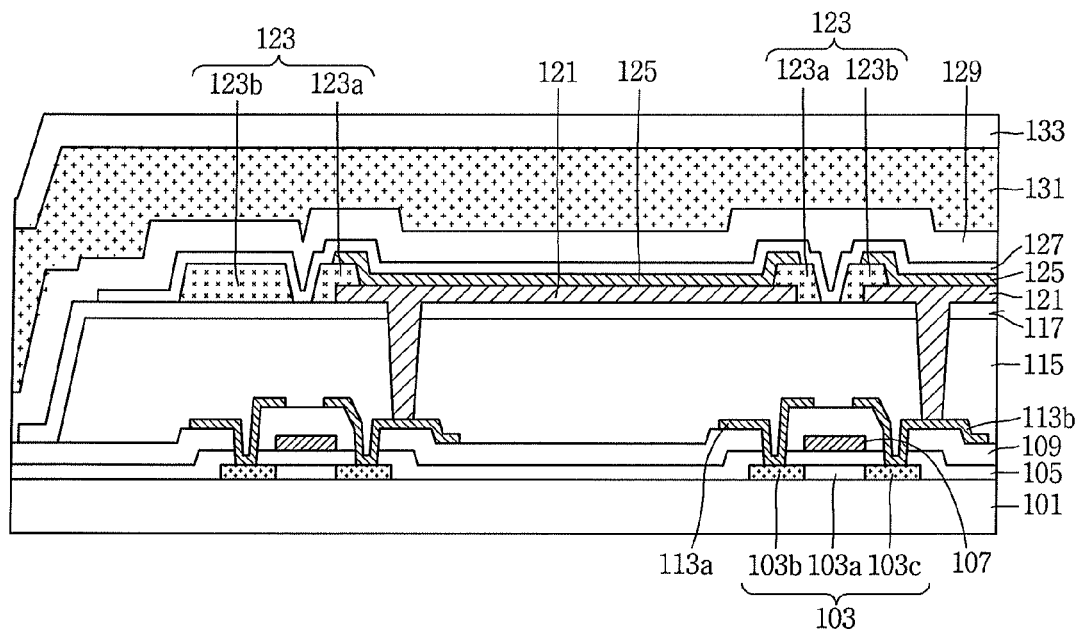

Next, as illustrated in FIG. 8J, a high organic molecular substance such as a polymer is coated over the first passivation layer 129 to form an organic layer 131. Here, olefin polymers (polyethylene, polypropylene), polyethylene terephthalate (PET), fluororesin, polysiloxane, epoxy resin, and the like may be used for the high molecular layer.

Subsequently, a second passivation layer 133 made of an insulation material, for example, silicon oxide ($SiO_2$) or silicon nitride (NiNx), which is an inorganic insulation material, is additionally formed on an entire surface of the substrate including the organic layer 131 to block moisture from being infiltrated through the organic layer 131.

Next, though not shown in the drawing, an adhesive is located on an entire surface of the substrate including the second passivation layer 133 to face a barrier film (not shown) for the encapsulation of the organic light emitting diode (E), and the adhesive (not shown) made of any one of a frit having a transparent adhesive characteristic, an organic insulation material, and a high molecular substance is interposed between the substrate 101 and barrier film (not shown), and completely glued to the substrate 101 and barrier film (not shown) with no air layer. Here, according to the present invention, a case of using a press sensitive adhesive (PSA) for the adhesive (not shown) will be described as an example.

In this manner, the substrate 101 is fixed to the barrier film (not shown) through the adhesive (not shown) to form a panel state, thereby completing the fabrication process of an organic electroluminescent device 100 according to the present invention.

Therefore, according to a method of fabricating an organic electroluminescent device in accordance with an embodiment of the present invention, an inorganic insulating layer may be additionally formed on an organic insulating layer on a substrate including a switching thin film transistor and a drive thin film transistor to cover an edge portion of the organic insulating layer so as to block a defect or moisture in advance from being infiltrated into the organic electroluminescent device, thereby enhancing the life of the organic electroluminescent device.

Furthermore, according to a method of fabricating an organic electroluminescent device in accordance with an embodiment of the present invention, banks may be formed in a separate manner independently from one another around each pixel region to prevent moisture from being diffused into another adjoining pixel region even when the defect or moisture is infiltrated into the organic electroluminescent device from the outside, thereby enhancing the reliability of the panel.

In addition, according to a method of fabricating an organic electroluminescent device in accordance with an embodiment of the present invention, the average height of the substrate may be uniformly maintained on the display unit and bezel portion, and also an adhesive, for example, a gluing agent, for adhering the display to an upper substrate, for example, an encapsulation glass substrate, a plastic plate and a polarizer, may be formed in a thin manner, thereby enhancing the reliability of the panel.

However, it may be understood by those skilled in the art that the foregoing present invention can be implemented in other specific forms without changing the technical concept and essential characteristics thereof.

Therefore, it should be understood that the foregoing embodiments are merely illustrative but not restrictive in all aspects. The scope of the present invention is defined by the appended claims rather than by the detailed description, and all changes or modifications derived from the meaning, scope and equivalent concept of the claims should be construed to be embraced by the scope of the present invention.

What is claimed is:

1. A flexible organic electroluminescent device, comprising:
    a substrate having a display area including a plurality of pixel regions and a non-display area at an outside of the display area;
    each pixel region of the plurality of pixel regions comprising:
    a switching thin film transistor and a drive thin film transistor formed on the substrate;
    an insulating layer on the substrate including a first organic layer and an inorganic layer on the first organic layer, wherein the insulating layer covering the switching thin film transistor and the drive thin film transistor exposes a drain electrode of the drive thin film transistor;
    a first electrode on the inorganic insulating layer, connected to the drain electrode of the drive thin film transistor;
    a bank formed on the substrate around each pixel region covering edges of the first electrode;
    an organic light emitting layer formed on the first electrode;
    a second electrode formed on the organic light emitting layer and on an entire surface of the display area; and
    a second organic layer formed on an entire surface of the second electrode,
    wherein each bank is separated from the bank of an adjacent pixel region of the plurality of pixel regions.

2. The flexible organic electroluminescent device of claim 1, wherein the substrate is configured with one selected from a flexible glass substrate and a plastic material.

3. The flexible organic electroluminescent device of claim 1, wherein a first passivation layer is at an upper surface and a second passivation layer is at a lower surface of the second organic layer.

* * * * *